(12) United States Patent
Lee et al.

(10) Patent No.: US 7,777,589 B2
(45) Date of Patent: Aug. 17, 2010

(54) BALUN TRANSFORMER

(75) Inventors: Kwang Du Lee, Jeollanam-do (KR); Yu Sin Kim, Daejeon (KR); Jeong Hoon Kim, Gyunggi-do (KR); Eung Ju Kim, Gyunggi-do (KR); Moon Suk Jeong, Gyunggi-do (KR); Sang Gyu Park, Gyunggi-do (KR); Dong Ok Han, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 197 days.

(21) Appl. No.: 12/187,022

(22) Filed: Aug. 6, 2008

(65) Prior Publication Data

US 2009/0039977 A1    Feb. 12, 2009

(30) Foreign Application Priority Data

Aug. 7, 2007    (KR) .................. 10-2007-0079036

(51) Int. Cl.
*H03H 11/32*    (2006.01)
*H01P 5/12*    (2006.01)
(52) U.S. Cl. ....................... 333/25; 333/100
(58) Field of Classification Search ............ 333/25, 333/26, 100
See application file for complete search history.

(56) References Cited

U.S. PATENT DOCUMENTS

| 3,735,289 | A  | * | 5/1973 | Bruene .................. 333/5 |
| 5,917,386 | A  | * | 6/1999 | Dobrovolny .............. 333/119 |
| 6,801,114 | B2 |   | 10/2004 | Yang et al. |
| 7,269,391 | B2 | * | 9/2007 | Chiu et al. ............ 455/83 |
| 2002/0095195 | A1 | * | 7/2002 | Mass et al. .............. 607/60 |
| 2008/0278258 | A1 | * | 11/2008 | Liu ..................... 333/25 |

FOREIGN PATENT DOCUMENTS

JP    2005-102140 A    4/2005
KR    1998-80178 A    11/1998

* cited by examiner

*Primary Examiner*—Dean O Takaoka
(74) *Attorney, Agent, or Firm*—Lowe Hauptman Ham & Berner LLP

(57) ABSTRACT

A balun transformer includes a first conductive pattern having one end provided as an input/output port of an unbalanced signal, a second conductive pattern electromagnetically coupled to the first conductive pattern and having both ends provided as input/output ports of a balanced signal, and a first variable capacitor connected between a ground part and a middle part of an electrical length of the second conductive pattern.

7 Claims, 4 Drawing Sheets

BALUN TRANSFORMER

CROSS-REFERENCE TO RELATED APPLICATIONS

This application claims the priority of Korean Patent Application No. 2007-79036 filed on Aug. 7, 2007, in the Korean Intellectual Property Office, the disclosure of which is incorporated herein by reference.

BACKGROUND OF THE INVENTION

1. Field of the Invention

The present invention relates to a balun transformer, and more particularly, to a balun transformer which can facilitate control of characteristics thereof according to an external condition and reduce energy loss by increasing the strength of electromagnetic coupling.

2. Description of the Related Art

The term 'balun' of a balun transformer is short for balance-unbalance. The balun transformer refers to a device that includes a circuit or a structure for converting a balanced signal to an unbalanced signal or vice versa. When a device including a balanced input/output port such as a mixer or an amplifier is connected with a device including an unbalanced input/output port such as an antenna, the balun transformer is used to perform conversion between the balanced and unbalanced signals.

The balun transformer may be realized by combining lumped elements such as resistance-inductance-capacitance (RLC) devices, or as a distributed element such as a microstrip line, a strip line, and a transmission line. The recent increase in demand for small wireless communication products employing balun transformers increases the use of multilayer balun transformers manufactured using, e.g., low-temperature co-fired (LTCC) technology in order to reduce the product size.

FIG. 1 is an equivalent circuit diagram of a related art balun transformer. The balun transformer includes four conductive signal lines 14 to 17 (hereinafter, also referred to first to fourth lines) each having a length of $\lambda/4$ ($\lambda=1/fc$ where fc denotes a center frequency of an input/output signal). One end of the first line 14 is connected to an unbalanced port 11 receiving or outputting an unbalanced signal of a predetermined frequency, and the other end of the first signal line 14 is connected to one end of the second line 15. The other end of the second line 15 is open. The third and fourth lines 16 and 17, each having one grounded end are disposed parallel to the first and second lines 14 and 15 for electrical coupling, respectively. The other ends of the third and fourth lines 16 and 17 are respectively connected to balanced ports 12 and 13 receiving or outputting balanced signals.

In the above configuration, the first line 14 and the third line 16 form one coupler, and the second line 15 and the fourth line 17 form one coupler. When an unbalanced signal of a predetermined frequency is applied to the unbalanced port 11, electromagnetic coupling occurs between the first and third lines 14 and 16 and between the second and fourth lines 15 and 17. Thus, balanced signals of the same frequency as that of the input unbalanced signal are output through the balanced ports 12 and 13. Here, the balanced signal being output through the balanced ports 12 and 13 have the same amplitude and a phase difference of approximately 180 degrees. In contrast, if balanced signals of a predetermined frequency, which have the same amplitude and a phase difference of approximately 180 degrees are respectively applied to the balanced ports 12 and 13, an unbalanced signal of the same frequency as that of the balanced signal is output from the unbalanced port 11.

As smaller balun transformers are increasingly demanded, research is actively ongoing to further miniaturize the balun transformers while maintaining or improving their fundamental characteristics. In the case of multilayer balun transformers for device miniaturization, their characteristics are affected to a great extent by external conditions. Also, the electronic coupling between couplers decreases in strength, causing energy loss.

SUMMARY OF THE INVENTION

An aspect of the present invention provides a balun transformer which can compensate for characteristic changes thereof and reduce energy loss by increasing the strength of electromagnetic coupling between couplers.

According to an aspect of the present invention, there is provided a balun transformer including: a first conductive pattern having one end provided as an input/output port of an unbalanced signal; a second conductive pattern electromagnetically coupled to the first conductive pattern and having both ends provided as input/output ports of a balanced signal; and a first variable capacitor connected between a ground part and a middle part of an electrical length of the second conductive pattern.

The balun transformer may further include a second variable capacitor connected to the other end of the first conductive pattern.

The first conductive pattern and the second conductive pattern are formed on one surface of a dielectric substrate. The first conductive pattern may be an inductor pattern including a plurality of loop patterns, and the second conductive pattern may be an inductor pattern including a plurality of loop patterns. The plurality of loop patterns of the first conductive pattern may concentrically alternate with the plurality of loop patterns of the second conductive pattern.

The first conductive pattern may be a symmetrical inductor pattern, and the second conductive pattern may be a symmetrical inductor pattern. The respective symmetrical inductor patterns of the first and second conductive patterns may be symmetrical about one virtual line.

Each of the first and second conductive patterns may include a portion disposed on the other surface of the dielectric substrate and connected with another portion of a corresponding one of the first and second conductive patterns disposed on the one surface of the dielectric substrate through a conductive via hole, so that the corresponding conductive pattern is not short-circuited.

The variable capacitor may be a varactor diode.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
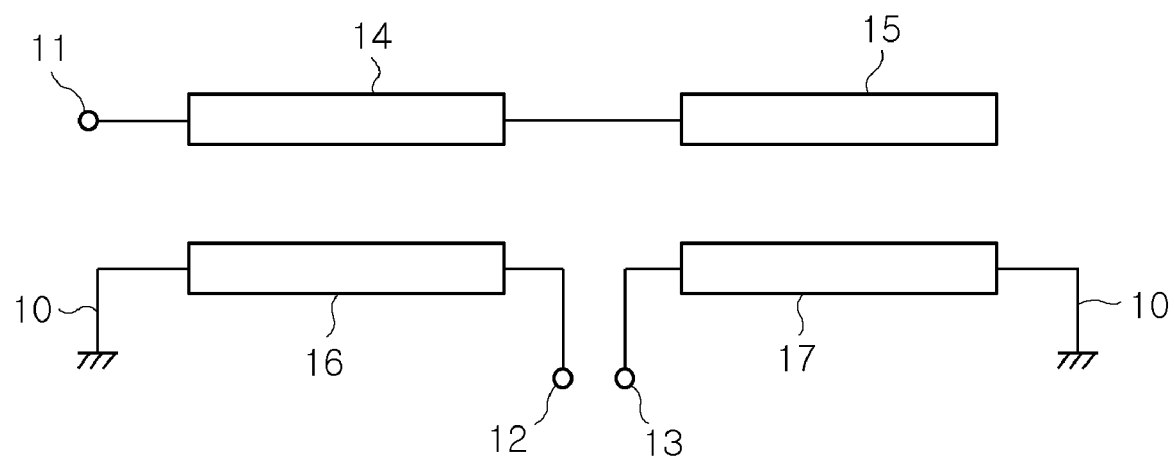
FIG. 1 is a circuit diagram of a related art balun transformer.
Figure 2:
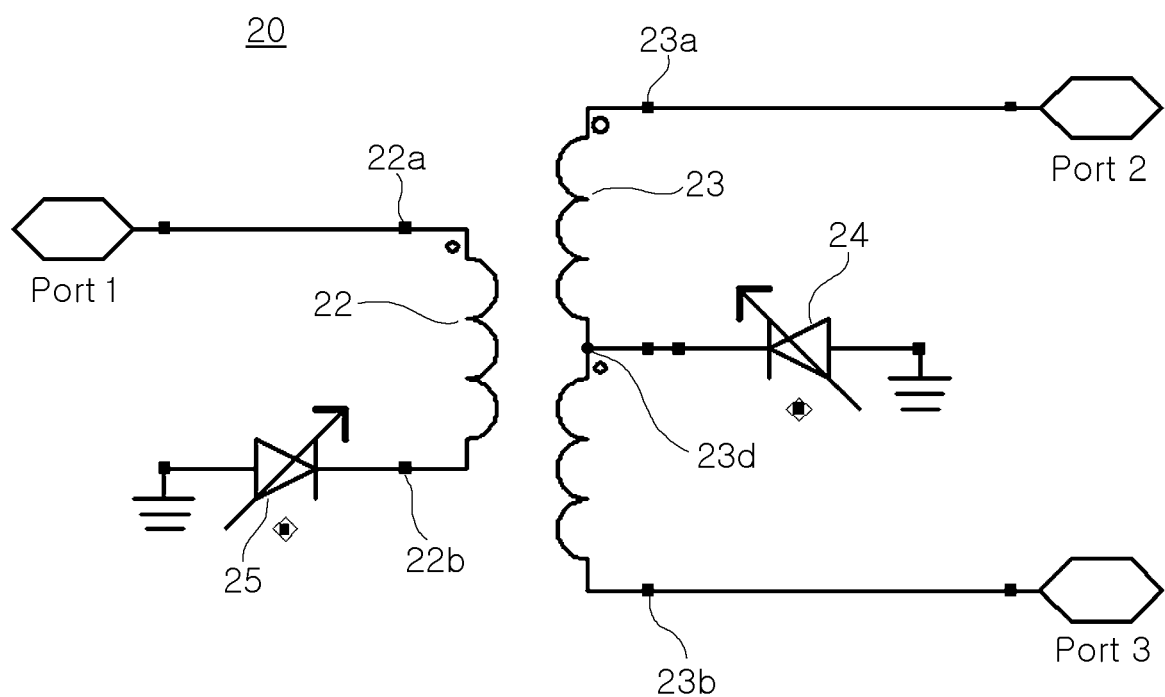
FIG. 2 is a circuit diagram of a balun transformer according to an exemplary embodiment of the present invention.

FIG. 2 is an equivalent circuit diagram of a balun transformer according to an exemplary embodiment of the present invention.

Referring to FIG. 2, a balun transformer 20 according to the current embodiment includes a first conductive pattern 22, a second conductive pattern 23, a first variable capacitor 24 and a second variable capacitor 25.

A middle part 23d of an electrical length of the second conductive pattern 23 may be connected to a ground part so that both ends of the second conductive patter 23 are used as input/output ports of a balanced signal. According to the current embodiment, the first variable capacitor 24 may be connected between the middle part 23d and the ground part.

The first conductive pattern 22 and the second conductive pattern 23 are electromagnetically coupled to each other. Thus, when an unbalanced signal is input to one port 22a of the first conductive pattern 22, balanced signals having the same amplitude and a phase difference of approximately 180 degrees may be respectively output to two ports 23a and 23b of the second conductive pattern 23. However, in actuality, the two output ports 23a and 23b may not have the signal phase difference of approximately 180 degrees and the same amplitude levels because the strength of the electromagnetic coupling varies according to the energy distribution. In this case, the phase difference and amplitude of signals at the two ports 23a and 23b can be corrected by controlling a capacitance value of the first variable capacitor 24.

According to the current embodiment, the second variable capacitor 25 may be connected to one end 22b of the first conductive pattern 22. The phase and amplitude of the unbalanced signal input to the first conductive pattern 22 may be controlled by controlling capacitance of the second variable capacitor 25.

According to the current embodiment, characteristic changes of the balun transformer caused by external conditions or process changes can be compensated by controlling the first variable capacitor 24 connected to the middle part 23d of the electrical length of the second conductive pattern 23, and the second variable capacitor 25 connected to the one end 22b of the first conductive pattern 22. Accordingly, costs incurred for re-adjustment of the characteristic changes caused in a manufacturing process can be saved.

Figure 3A:
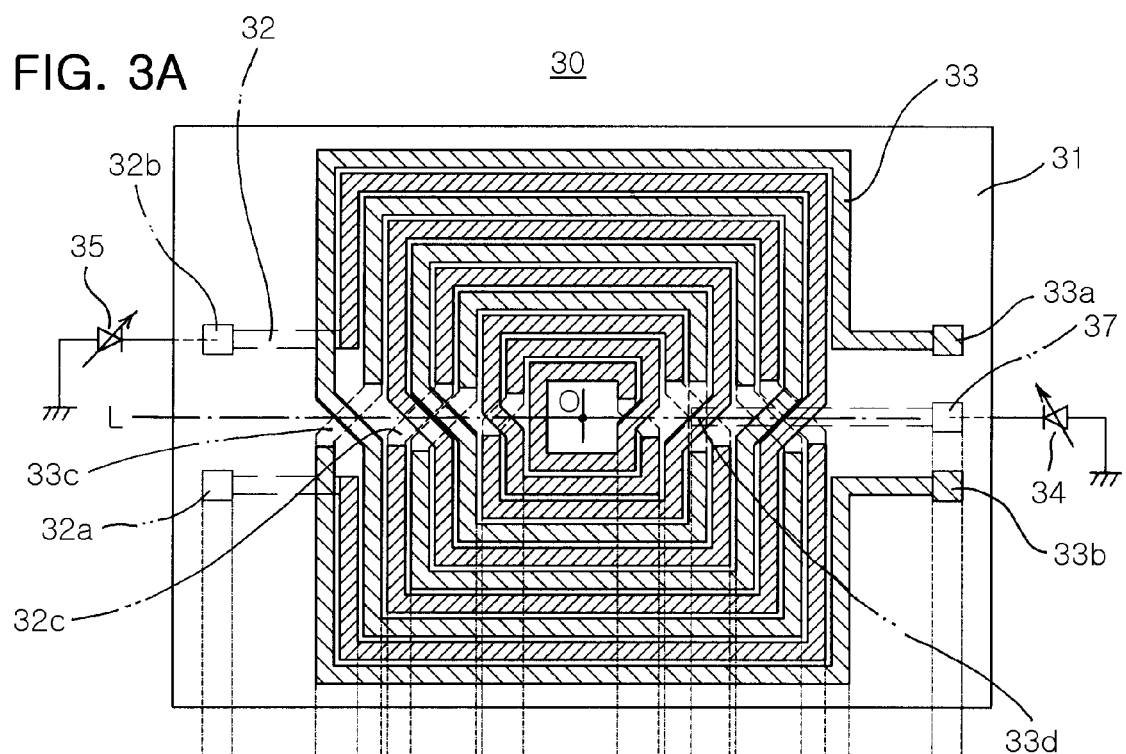
FIG. 3A is a plan view of a balun transformer according to another exemplary embodiment of the present invention.
Figure 3B:
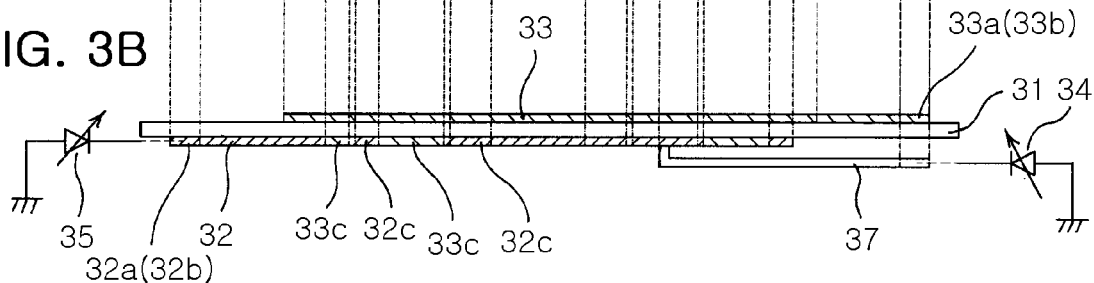
FIG. 3B is a sectional view of the balun transformer of FIG. 3A.

FIG. 3A is a plan view of a balun transformer according to another exemplary embodiment of the present invention, and FIG. 3B is a sectional view of the balun transformer of FIG. 3A.

Referring to FIGS. 3A and 3B, a balun transformer 30 according to the current embodiment may include a dielectric substrate 31, a first conductive pattern 32, a second conductive pattern 33, a first variable capacitor 34, and a second variable capacitor 35.

An example of the dielectric substrate 31 may include a ceramic substrate having a predetermined dielectric constant.

A first conductive pattern 32 and a second conductive pattern 33 may be formed on one surface of the dielectric substrate 31. The first and second conductive patterns 32 and 33 may be electromagnetically coupled to each other. According to the current embodiment, one end 32a of the first conductive pattern 32 may be used as an input port of an unbalanced signal. Both ends 33a and 33b of the second conductive pattern 33 may be used as output ports of balanced signals.

The first conductive pattern 32 may be an inductor pattern including a plurality of conductive loop lines connected in series, concentrically disposed around a central point 'O'.

The plurality of conductive loop lines of the first conductive pattern 32 may have different sizes and be concentrically spaced apart from each other at a constant interval. According to the current embodiment, a portion 32c of the first conductive pattern 32 may be formed on the other surface of the dielectric substrate 31. The portion 32c of the first conductive pattern 32 is connected to another portion of the first conductive pattern 32 disposed on the one surface of the dielectric substrate 31 through a conductive via hole. Hence, the plurality of conductive loop lines of the first conductive pattern 32 can be connected in series without contacting each other.

The plurality of conductive loop lines of the first conductive pattern 32 may be symmetrical about a virtual line 'L'. The plurality of conductive loop lines may be disposed parallel to each other at a constant interval.

One end 32a of the outermost conductive loop line of the first conductive pattern 32 may be used as an input port or an output port of an unbalanced signal.

The second conductive pattern 33 may be an inductor pattern including a plurality of conductive loop lines. The plurality of conductive loop lines of the second conductive pattern 33 may be alternated with the plurality of conductive loop lines of the first conductive pattern 32, so that the second conductive pattern 33 is electromagnetically coupled to the first conductive pattern 32. The plurality of conductive loop lines may be connected in series, disposed concentrically around the same central point 'O' as the first conductive pattern 32.

The plurality of conductive loop lines of the second conductive pattern 33 may have different sizes and be concentrically spaced apart from each other at a constant interval. According to the current embodiment, a portion 33c of the second conductive pattern 33 may be formed on the other surface of the dielectric substrate 31. The portion 33c of the second conductive pattern 33 may be connected to another portion of the second conductive pattern 33 disposed on the one surface of the dielectric substrate 31 through a conductive via hole. Accordingly, the plurality of conductive loop lines of the second conductive pattern 33 can be connected in series without being short-circuited.

The plurality of conductive loop lines of the second conductive pattern 33 may be symmetrical about the virtual line 'L'. The plurality of conductive loop lines of the second conductive pattern 33 may be disposed parallel to each other at a constant interval.

Both ends 33a and 33b of the second conductive pattern 33 may be used as input/output ports of balanced signals.

According to the current embodiment, the first conductive pattern 32 and second conductive pattern 33 may each be symmetrical about the virtual line 'L'.

Both ends of each of the first and second conductive patterns 32 and 33 may be placed on the same plane at the right and left sides of the virtual line L. Also, in each of the first and second conductive patterns 32 and 33, the plurality of concentric conductive loop lines having different radii may be connected in series. Thus, the first conductive pattern 32 and second conductive pattern 33 may have the symmetrical shapes. The first conductive pattern 32 may be alternated with the second conductive pattern 33.

Since the first and second conductive patterns 32 and 33 are placed on the same plane of the dielectric substrate 31, the first and second conductive patterns 32 and 33 may be electromagnetically coupled with the increased strength.

That is, when a current is applied to the input port 32a of the first conductive pattern 32, the current flows even in the second conductive pattern 33, which is alternated with and electromagnetically coupled to the first conductive pattern 32.

A magnetic field is generated by the current flowing through the first conductive pattern 32. Thus, from Flemming's right hand rule, the current can flow through the second conductive pattern 33, which is alternated with the first conductive pattern 32 in the same direction as that of the current flowing through the first conductive pattern 32.

The first conductive pattern 32 and the second conductive pattern 33 alternated on the same plane of the dielectric substrate 31 increases the strength of electromagnetic coupling between the first and second conductive patterns 32 and 33. Thus, energy loss can be reduced.

A middle part 33d of the electrical length of the second conductive pattern 33 may be connected to a ground part in order to use both ends 33a and 33b of the second conductive pattern 33 as input/output ports of balanced signals. According to the current embodiment, the first variable capacitor 34 may be connected between the middle part 33d of the electrical length of the second conductive pattern 33 and the ground part. The first variable capacitor 34 may be a varactor diode.

In the balun transformer 30 according to the current embodiment, the first conductive pattern 32 and the second conductive pattern 33 are electromagnetically coupled to each other. Thus, when an unbalanced signal is input to one port 32a of the first conductive pattern 32, balanced signals having the same amplitude and a phase difference of approximately 180 degrees can be output from the two ports 33a and 33b of the second conductive pattern 33. However, in actuality, the two ports 33a and 33b may not have the signal phase difference of approximately 180 degrees and the same amplitude levels because the strength of the electromagnetic coupling varies according to the energy distribution. In this case, the signal phases and amplitude at the two ports 33a and 33b can be corrected by controlling a capacitance value of the first variable capacitor 34.

According to the current embodiment, the second variable capacitor 35 may be connected to one end 32b of the first conductive pattern 32.

In the balun transformer 30 according to the current embodiment, the first conductive pattern 32 and the second conductive pattern 33 are electromagnetically coupled to each other. Thus, when an unbalanced signal is input to the one port 32a of the first conductive pattern 32, balanced signals having the same amplitude and a phase difference of approximately 180 degrees can be respectively output to the two ports 33a and 33b of the second conductive pattern 33. However, in actuality, the two ports 33a and 33b may not have the signal phase difference of approximately 180 degrees and the same amplitude because the strength of the electromagnetic coupling varies according to the energy distribution. In this case, the signal phases and amplitude at the two ports 33a and 33b can be corrected by controlling a capacitance value of the second variable capacitor 35.

According to the current embodiment, changes in characteristics of the balun transformer caused by external conditions or process changes can be compensated by separately controlling the first variable capacitor 34 connected to the middle part 33d of the electrical length of the second conductive pattern 33, and the second variable capacitor 35 connected to the one end 32b of the first conductive pattern 32. Accordingly, costs incurred for re-adjustment of the characteristic changes occurring in a manufacturing process can be saved.

Figure 4A:
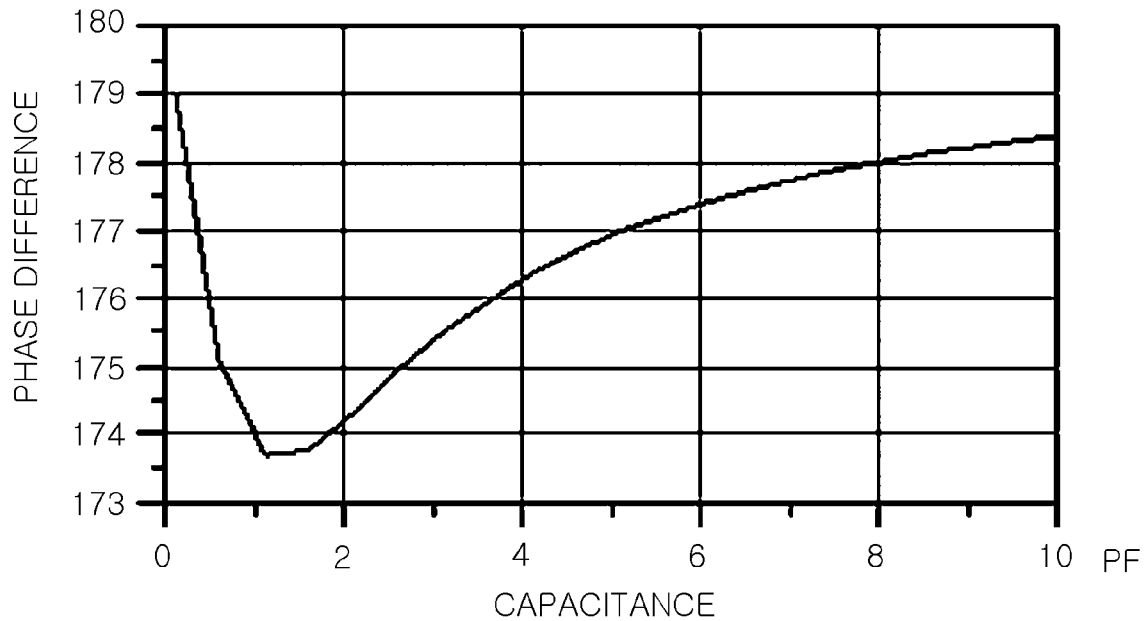
FIG. 4A is a graph showing a phase difference with respect to capacitance at a balanced port of the balun transformer of FIG. 2.
Figure 4B:
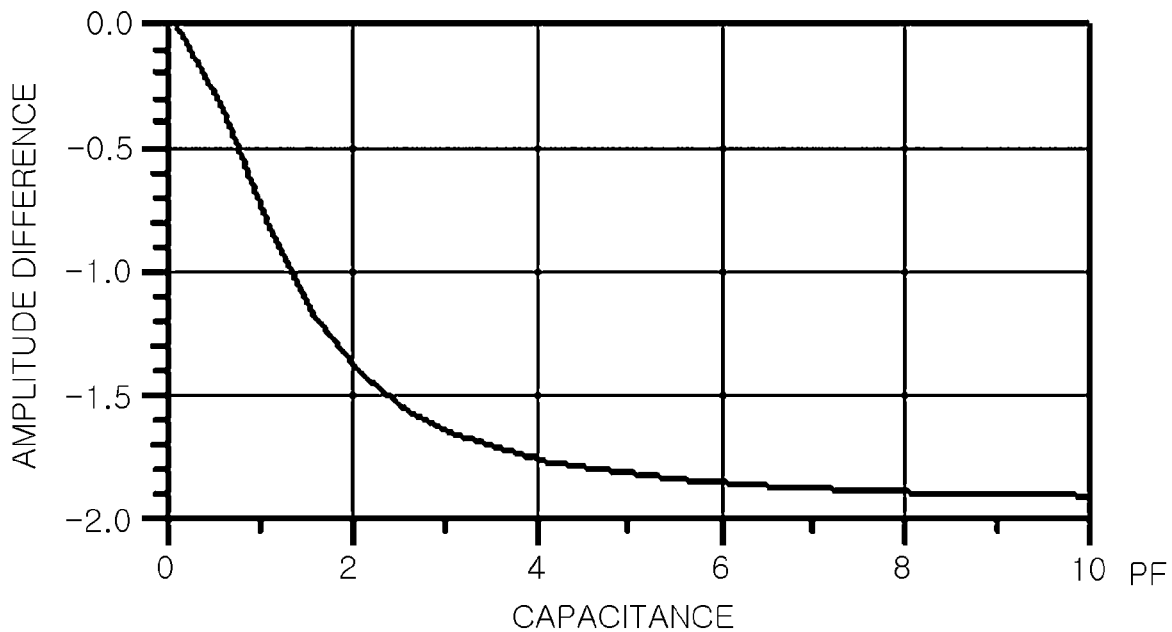
FIG. 4B is a graph showing an amplitude difference with respect to capacitance at the balanced port of FIG. 4A.

FIGS. 4A and 4B are graphs respectively showing a phase difference and an amplitude difference with respect to a capacitance value obtained by controlling a variable capacitor of a balun transformer according to the embodiment of FIG. 2.

In the graph of FIG. 4A, an X-axis represents values of capacitance generated by controlling first and second variable capacitors of a balun transformer, and an Y-axis represents phase difference values at balanced ports.

In an ideal balun transformer, a desirable phase difference between the balanced ports is approximately 180 degrees. However, the phase difference between the balanced ports may fail to reach approximately 180 degrees because of the manufacturing process or external conditions. Therefore, according to the current embodiment, the first variable capacitor and/or the second variable capacitor are properly controlled to achieve the phase difference of approximately 180 degrees.

In the graph of FIG. 4B, an X-axis represents values of capacitance generated by controlling the first and second variable capacitors of the balun transformer, and the Y-axis represents phase difference values at the balanced ports.

In an ideal balun transformer, the signal amplitude is the same between the balanced ports. However, the balanced parts may differ from each other in amplitude of output signals because of manufacturing processes or external conditions. Accordingly, the difference in signal amplitude between the balanced ports can be minimized by properly controlling the first variable capacitor and/or the second variable capacitor as in the current embodiment.

According to the present invention, the balun transformer facilitates compensation for its characteristic changes caused by manufacturing processes and external conditions, and reduces energy loss by increasing the strength of electromagnetic coupling.

While the present invention has been shown and described in connection with the exemplary embodiments, it will be apparent to those skilled in the art that modifications and variations can be made without departing from the spirit and scope of the invention as defined by the appended claims.

What is claimed is:

1. A balun transformer comprising:
   a first conductive pattern having one end provided as an input/output port of an unbalanced signal;
   a second conductive pattern electromagnetically coupled to the first conductive pattern and having both ends provided as input/output ports of a balanced signal; and
   a first variable capacitor connected between a ground part and a middle part of an electrical length of the second conductive pattern.

2. The balun transformer of claim 1, further comprising a second variable capacitor connected to the other end of the first conductive pattern.

3. The balun transformer of claim 1, wherein the first conductive pattern and the second conductive pattern are formed on one surface of a dielectric substrate.

4. The balun transformer of claim 3, wherein the first conductive pattern is an inductor pattern including a plurality of loop patterns, and the second conductive pattern is an inductor pattern including a plurality of loop patterns, the plurality of loop patterns of the first conductive pattern concentrically alternating with the plurality of loop patterns of the second conductive pattern.

5. The balun transformer of claim 4, wherein the first conductive pattern is a symmetrical inductor pattern, and the second conductive pattern is a symmetrical inductor pattern, the respective symmetrical inductor patterns of the first and second conductive patterns being symmetrical about one virtual line.

6. The balun transformer of claim 3, wherein each of the first and second conductive patterns comprises a portion disposed on the other surface of the dielectric substrate and connected with another portion of a corresponding one of the first and second conductive patterns disposed on the one surface of the dielectric substrate through a conductive via hole, so that the corresponding conductive pattern is not short-circuited.

7. The balun transformer of claim 1, wherein the variable capacitor is a varactor diode.

* * * * *